(12) United States Patent
Mergener et al.

(10) Patent No.: US 10,498,195 B2
(45) Date of Patent: Dec. 3, 2019

(54) PRINTED CIRCUIT BOARD SPACER

(71) Applicant: Milwaukee Electric Tool Corporation, Brookfield, WI (US)

(72) Inventors: Matthew J. Mergener, Mequon, WI (US); Daniel R. Ertl, Brookfield, WI (US)

(73) Assignee: MILWAUKEE ELECTRIC TOOL CORPORATION, Brookfield, WI (US)

( * ) Notice: Subject to any disclaimer, the term of this patent is extended or adjusted under 35 U.S.C. 154(b) by 0 days.

(21) Appl. No.: 16/155,488

(22) Filed: Oct. 9, 2018

(65) Prior Publication Data

US 2019/0052149 A1    Feb. 14, 2019

Related U.S. Application Data

(63) Continuation of application No. 15/203,895, filed on Jul. 7, 2016, now Pat. No. 10,128,723.

(60) Provisional application No. 62/189,497, filed on Jul. 7, 2015.

(51) Int. Cl.
| | |
|---|---|
| H05K 7/20 | (2006.01) |
| H02K 7/14 | (2006.01) |
| H05K 1/18 | (2006.01) |
| H02K 11/33 | (2016.01) |
| H02K 9/22 | (2006.01) |
| H01L 23/34 | (2006.01) |
| H05K 1/02 | (2006.01) |

(52) U.S. Cl.
CPC ............. *H02K 7/145* (2013.01); *H01L 23/34* (2013.01); *H02K 9/22* (2013.01); *H02K 11/33* (2016.01); *H05K 1/181* (2013.01); *H05K 1/0203* (2013.01); *H05K 1/0271* (2013.01); *H05K 2201/09* (2013.01); *H05K 2201/10166* (2013.01); *H05K 2201/2036* (2013.01)

(58) Field of Classification Search
None
See application file for complete search history.

(56) References Cited

U.S. PATENT DOCUMENTS

| | | | |
|---|---|---|---|
| 5,946,192 | A | 8/1999 | Ishigami et al. |
| 6,362,516 | B1 | 3/2002 | Waters |
| 6,407,924 | B1 | 6/2002 | Brodsky |
| 6,483,708 | B2 | 11/2002 | Ali et al. |
| 7,209,354 | B2 | 4/2007 | Wu et al. |
| 7,428,154 | B2 | 9/2008 | Ishimine et al. |
| 7,808,100 | B2 | 10/2010 | Bayerer |
| 8,344,675 | B2 | 1/2013 | Miwa et al. |
| 8,446,120 | B2 | 5/2013 | Forster et al. |

(Continued)

*Primary Examiner* — Courtney L Smith
(74) *Attorney, Agent, or Firm* — Michael Best Friedrich LLP (57) ABSTRACT

A power tool and a printed circuit board assembly ("PCBA") for the power tool. The PCBA includes, for example, a printed circuit board ("PCB"), a heat sink, a spacer between the PCB and the heat sink, and a gap pad. The PCB and the heat sink are fastened to one another via fasteners so the spacer absorbs excess forces torsional forces from torques applied to the fasteners. The gap pad is placed within an opening or recess of the spacer to contact one or more FETs on the PCB. In some embodiments, the PCBA includes a second heat sink or rigid member on the opposite side of the PCB than the spacer to further distribute excess torsional forces from torques applied to the fasteners.

19 Claims, 10 Drawing Sheets

(56) References Cited

U.S. PATENT DOCUMENTS

| | | | |
|---|---|---|---|
| 8,567,521 B2 | 10/2013 | Lau | |
| 8,933,558 B2 | 1/2015 | Watanabe et al. | |
| 9,161,475 B2 * | 10/2015 | Ng | G06F 1/20 |
| 9,590,475 B2 | 3/2017 | Oomori et al. | |
| 10,128,723 B2 * | 11/2018 | Mergener | H05K 1/181 |
| 2004/0140554 A1 * | 7/2004 | Kataria | H01L 23/4006 |
| | | | 257/706 |
| 2005/0272257 A1 | 12/2005 | Fuchs et al. | |
| 2006/0126309 A1 * | 6/2006 | Bolle | H05K 7/20436 |
| | | | 361/719 |
| 2006/0279966 A1 | 12/2006 | Fan et al. | |
| 2008/0179078 A1 | 7/2008 | Opsitos | |
| 2010/0091460 A1 | 4/2010 | Hinze et al. | |
| 2010/0226102 A1 | 9/2010 | So et al. | |
| 2011/0170258 A1 * | 7/2011 | Single | B25F 5/008 |
| | | | 361/688 |
| 2013/0207491 A1 | 8/2013 | Hatfield et al. | |
| 2013/0313925 A1 | 11/2013 | Mergener et al. | |
| 2015/0282337 A1 | 10/2015 | Ekstrom et al. | |
| 2015/0295478 A1 | 10/2015 | Creviston et al. | |
| 2016/0044825 A1 | 2/2016 | Baer et al. | |
| 2016/0295681 A1 | 10/2016 | Yamamoto | |

* cited by examiner

PRINTED CIRCUIT BOARD SPACER

RELATED APPLICATIONS

This application is a continuation of U.S. Non-Provisional patent application Ser. No. 15/203,895, filed Jul. 7, 2016, and claims the benefit of U.S. Provisional Patent Application No. 62/189,497, filed Jul. 7, 2015, the entire contents of each of which are hereby incorporated by reference.

FIELD OF THE INVENTION

The present invention relates to a printed circuit board assembly ("PCBA") for a power tool.

SUMMARY

Power tools often include a printed circuit board ("PCB") that includes one or more switches operable for controlling the operation of the power tool. For example, the PCB could include one or more field-effect transistors ("FETs"). Some FETs, such as DirectFET MOSFETs, have improved power density over conventional FETs and are top-side cooled. It is important for such FETs to be properly cooled, or to have their heat effectively sunk, in order to prevent damage to the FETs. However, variations in soldering height, FET height, and PCB bending or warping can create gaps between the FETs and a thermal interface material or heat sink. A gap between the FETs and the thermal interface material or heat sink reduces the effectiveness of the heat sinking, which can cause damage to the FETs.

This invention relates to a power tool and a printed circuit board assembly ("PCBA") for a power tool. The PCBA includes, for example, a printed circuit board ("PCB"), a heat sink, a spacer (e.g., a rigid spacer, a flexible spacer, etc.) between the PCB and the heat sink, and a gap pad. The PCB and the heat sink are fastened to one another via fasteners (e.g., screws) so the spacer absorbs excess torsional forces from torques applied to the fasteners. The gap pad is placed within an opening or recess of the spacer to contact one or more FETs on the PCB. In some embodiments, the PCBA includes a second heat sink or rigid member on the opposite side of the PCB than the spacer to further distribute excess torsional forces from torques applied to the fasteners.

In one embodiment, the invention provides a power tool that includes a motor and a printed circuit board assembly ("PCBA"). The PCBA is electrically connected to the motor for powering the motor. The PCBA includes a printed circuit board ("PCB") that includes a switch, a heat sink operable to dissipate heat generated by the switch and coupled to the PCB by one or more fasteners, and a spacer located between the PCB and the heat sink. The spacer is operable to absorb torsional forces from torque applied to the one or more fasteners.

In another embodiment, the invention provides a printed circuit board assembly ("PCBA") for a power tool that includes a motor. The PCBA includes a printed circuit board ("PCB") that includes a switch, a heat sink operable to dissipate heat generated by the switch and coupled to the PCB by one or more fasteners, and a spacer located between the PCB and the heat sink. The spacer is operable to absorb torsional forces from torque applied to the one or more fasteners.

In another embodiment the invention provides a printed circuit board assembly ("PCBA") for a power tool that includes a motor. The PCBA includes a printed circuit board ("PCB") that includes a switch, a heat sink operable to dissipate heat generated by the switch and coupled to the PCB by one or more fasteners, and a spacer located between the PCB and the heat sink. The spacer is operable to absorb torsional forces from torque applied to the one or more fasteners. The PCBA also includes a rigid member separated from the spacer by the PCB and located on an opposite side of the PCB than the spacer.

Before any embodiments of the invention are explained in detail, it is to be understood that the invention is not limited in its application to the details of the configuration and arrangement of components set forth in the following description or illustrated in the accompanying drawings. The invention is capable of other embodiments and of being practiced or of being carried out in various ways. Also, it is to be understood that the phraseology and terminology used herein are for the purpose of description and should not be regarded as limiting. The use of "including," "comprising," or "having" and variations thereof herein are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings.

In addition, it should be understood that embodiments of the invention may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic based aspects of the invention may be implemented in software (e.g., stored on non-transitory computer-readable medium) executable by one or more processing units, such as a microprocessor and/or application specific integrated circuits ("ASICs"). As such, it should be noted that a plurality of hardware and software based devices, as well as a plurality of different structural components may be utilized to implement the invention. For example, "servers" and "computing devices" described in the specification can include one or more processing units, one or more computer-readable medium modules, one or more input/output interfaces, and various connections (e.g., a system bus) connecting the components.

DETAILED DESCRIPTION

The invention described herein relates to a power tool and a printed circuit board assembly ("PCBA") for a power tool. The PCBA includes, for example, a power printed circuit board ("PCB"), a control PCB, and a heat sink. The power PCB and the heat sink are fastened or coupled to one another with one or more fasteners, such as screws. When fastening the power PCB and heat sink, torsional forces resulting from torques applied to the fasteners can cause the power PCB to bend or warp. This bending or warping can create a gap between the heat sink and switches, such as field-effect transistors ("FETs"), located on the power PCB. The gap reduces the effectiveness of the heat sink to dissipate heat generated by the FETs. In order to prevent or mitigate the bending and warping of the power PCB, and therefore preventing potential damage to the FETs from overheating, a spacer (e.g., a rigid spacer, a flexible spacer, etc.) is placed between the power PCB and the heat sink. The power PCB and the heat sink are fastened to one another so the spacer absorbs excess torsional forces from torques applied to the fasteners. A gap pad is located within an opening or recess of the spacer to contact the FETs and improve thermal contact between the FETs and the heat sink. In some embodiments, the PCBA includes a second heat sink or rigid member on the opposite side of the power PCB than the spacer to further distribute excess torsional forces from torques applied to the screws. The invention can be used with any power tool that includes a PCB and/or switches that generate heat that would desirably be dissipated or sunk.

Figure 1:
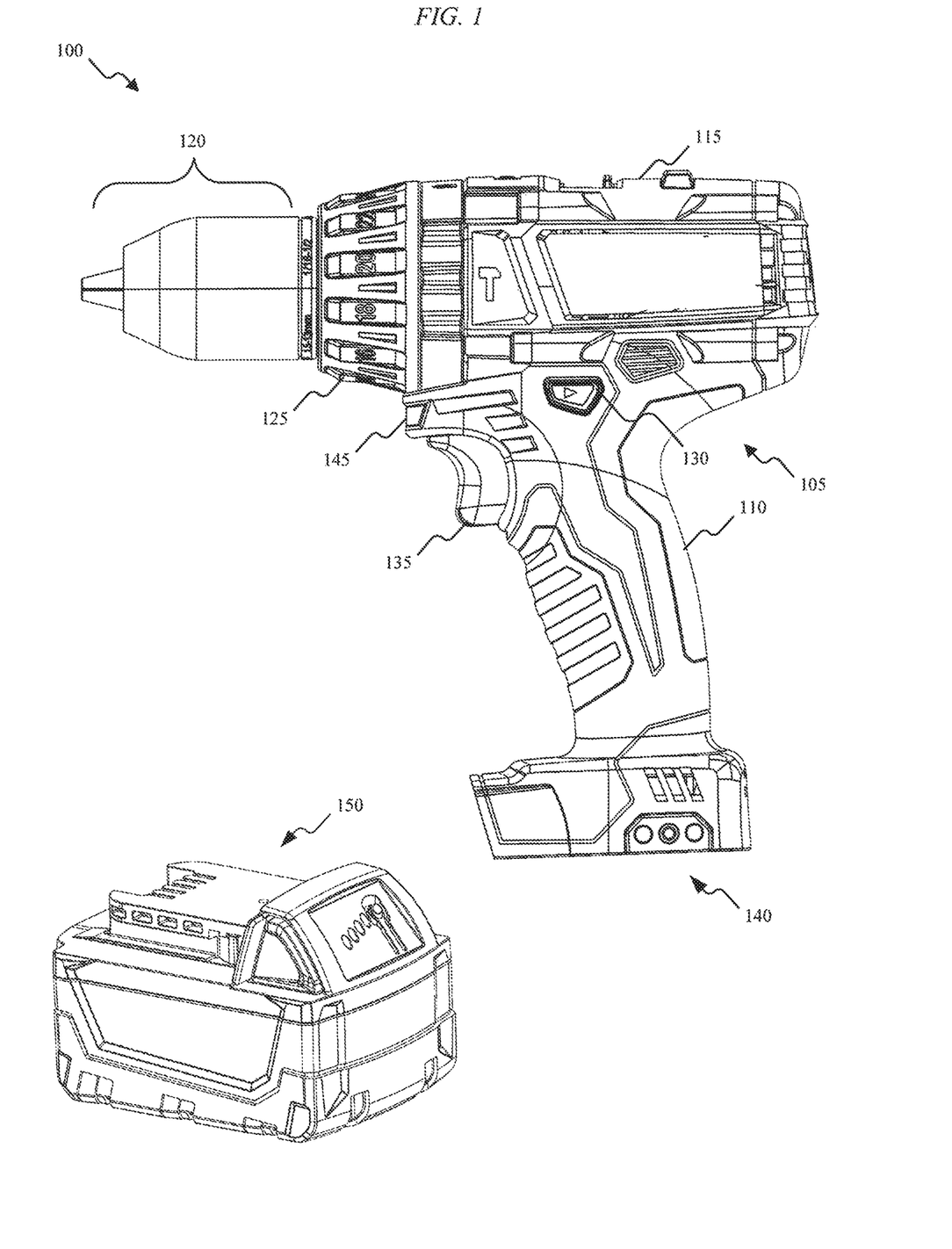
FIG. 1 illustrates a power tool incorporating a brushless direct current ("BLDC") motor and a power source for the power tool.
Figure 2:
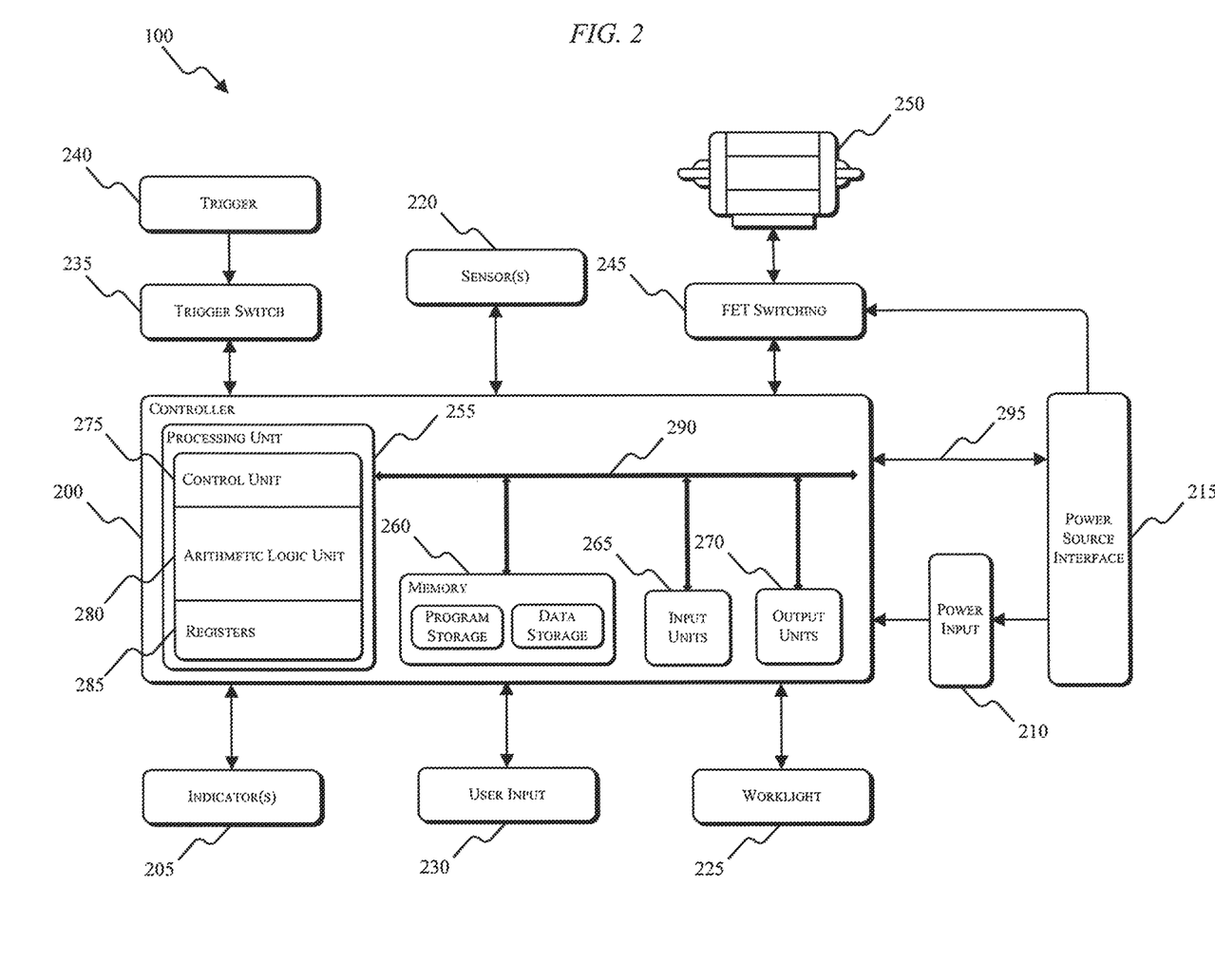
FIG. 2 is a block diagram of a power tool, such as the power tool illustrated in FIG. 1.

FIG. 1 illustrates a power tool 100 including a brushless direct current ("BLDC") motor (see FIG. 2). The power tool 100 illustrated in FIG. 1 is a hammer drill. However, the invention can also be applied to power tools such as drill/drivers, impact wrenches, torque wrenches, saws, pipe cutters, or any other power tool that includes a PCB and one or more switches (e.g., transistors, FETs, etc.). The power tool 100 includes a housing 105 with a handle portion 110 and a motor housing portion 115. The power tool 100 also includes an output unit 120, a torque setting dial 125, a forward/reverse selector 130, a trigger 135, battery pack interface 140, and a worklight 145. The power tool 100 is powered by a power source, such as a battery pack 150.

Power tools like the power tool 100 include switching elements that are selectively enabled and disabled by control signals from a controller to apply driving power from a power source (e.g., battery pack 150) to a motor. For example, FIG. 2 illustrates a controller 200 associated with the power tool 100. The controller 200 is electrically and/or communicatively connected to a variety of modules or components of the power tool 100. The illustrated controller 200 is connected to one or more indicators 205, a power input module 210, a power source interface 215, one or more sensors 220, a worklight 225, a user input module 230, a trigger switch 235 (connected to a trigger 240), and a FET switching module 245 (e.g., including the switching elements noted above). In some embodiments, the trigger switch 235 is combined and integral with the controller 200 within a housing within the power tool 100. The controller 200 includes combinations of hardware and software that are operable to, among other things, control the operation of the power tool 100, activate the one or more indicators 205 (e.g., an LED), monitor the operation of the power tool 100, etc.

In some embodiments, the controller 200 includes a plurality of electrical and electronic components that provide power, operational control, and protection to the components and modules within the controller 200 and/or power tool 100. For example, the controller 200 includes, among other things, a processing unit 255 (e.g., a microprocessor, a microcontroller, or another suitable programmable device), a memory 260, input units 265, and output units 270. The processing unit 255 includes, among other things, a control unit 275, an arithmetic logic unit ("ALU") 280, and a plurality of registers 285 (shown as a group of registers in FIG. 2), and is implemented using a known computer architecture, such as a modified Harvard architecture, a von Neumann architecture, etc. The processing unit 255, the memory 260, the input units 265, and the output units 270, as well as the various modules connected to the controller 200 are connected by one or more control and/or data buses (e.g., common bus 290). The control and/or data buses are shown generally in FIG. 2 for illustrative purposes. The use of one or more control and/or data buses for the interconnection between and communication among the various modules and components would be known to a person skilled in the art in view of the invention described herein.

The memory 260 includes, for example, a program storage area and a data storage area. The program storage area and the data storage area can include combinations of different types of memory, such as read-only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, electronic memory devices, or data structures. The processing unit 255 is connected to the memory 260 and executes software instructions that are capable of being stored in a RAM of the memory 260 (e.g., during execution), a ROM of the memory 260 (e.g., on a generally permanent basis), or another non-transitory computer readable medium such as another memory or a disc. Software included in the implementation of the power tool can be stored in the memory 260 of the controller 200. The software includes, for example, firmware, one or more applications, program data, filters, rules, one or more program modules, and other executable instructions. The controller 200 is configured to retrieve from memory and execute, among other things, instructions related to control processes and methods. In other constructions, the controller 200 includes additional, fewer, or different components.

The power source interface 215 includes a combination of mechanical and electrical components (e.g., a plurality of terminals) configured to and operable for interfacing (e.g., mechanically, electrically, and communicatively connecting [via communication line 295]) the power tool 100 with a power source (e.g., a lithium-based battery pack such as battery pack 150). For example, power provided by the battery pack 150 to the power tool 100 is provided through the power source interface 215 to the power input module 210. The power input module 210 includes combinations of active and/or passive components to regulate or control the power received from the battery pack prior to power being provided to the controller. The power source interface 215 also supplies power to the FET switching module 245 to be switched by the switching FETs to selectively provide power to the motor 250. In some embodiments, the power source interface 215 interfaces with an AC power source (e.g., 120V/60 Hz mains power) from a tool plug that is coupled to a standard wall outlet. In such embodiments, the power input module 210 is operable or configured to filter, condition, and rectify the received power to provide DC power to the power tool 100.

The trigger switch 235 is connected to the trigger 240 (e.g., the trigger 135 of FIG. 1) for controlling the power provided to the motor 250 through the switching FETs. In some embodiments, the amount of trigger pull detected by the trigger switch 235 is related to or corresponds to a desired speed of rotation of the motor 250. In other embodiments, the amount of trigger pull detected by the trigger switch 235 is related to or corresponds to a desired torque. In response to the trigger switch 235, the controller 200 is operable or configured to transmit control signals to control the FET switching module 245 to drive the motor 250. By selectively enabling and disabling the FETs in the FET switching module 245, power from a power source is selectively applied to the motor 250 to cause rotation of a rotor. The worklight 225 (e.g., the worklight 145 in FIG. 1) is controlled by the controller 200. In some embodiments, the worklight 225 is illuminated when the trigger 240 is pulled. In other embodiments, a dedicated switch or button is provided on the power tool 100 or battery pack 150 for activating the worklight without pulling the trigger 240. The worklight 225 can remain illuminated for a duration corresponding to an amount of time that the trigger 240 is pulled. The sensors 220 include, for example, one or more current sensors, one or more speed sensors, one or more Hall Effect sensors, one or more temperature sensors, etc. For example, Hall Effect sensors output motor feedback information, such as an indication (e.g., a pulse) when a magnet of the rotor rotates across the face of that Hall sensor. The controller 200 can determine the position, velocity, and acceleration of the motor 250 based on the motor feedback information from the Hall Effect sensors.

The user input module 230 is operably coupled to the controller 200 to, for example, select a forward mode of operation or a reverse mode of operation, a torque and/or speed setting for the power tool 100 (e.g., using the torque and/or speed switches), etc. In some embodiments, the user input module 230 includes a combination of digital and analog input or output devices required to achieve a desired level of operation for the power tool 100, such as one or more knobs, one or more dials, one or more switches, one or more buttons, etc. The indicators 205 include, for example, one or more light-emitting diodes ("LED"). The indicators 205 can be configured to display conditions of, or information associated with, the power tool 100. For example, the indicators 205 are configured to indicate measured electrical characteristics of the power tool 100, the status of the power tool 100, etc.

Figure 3:
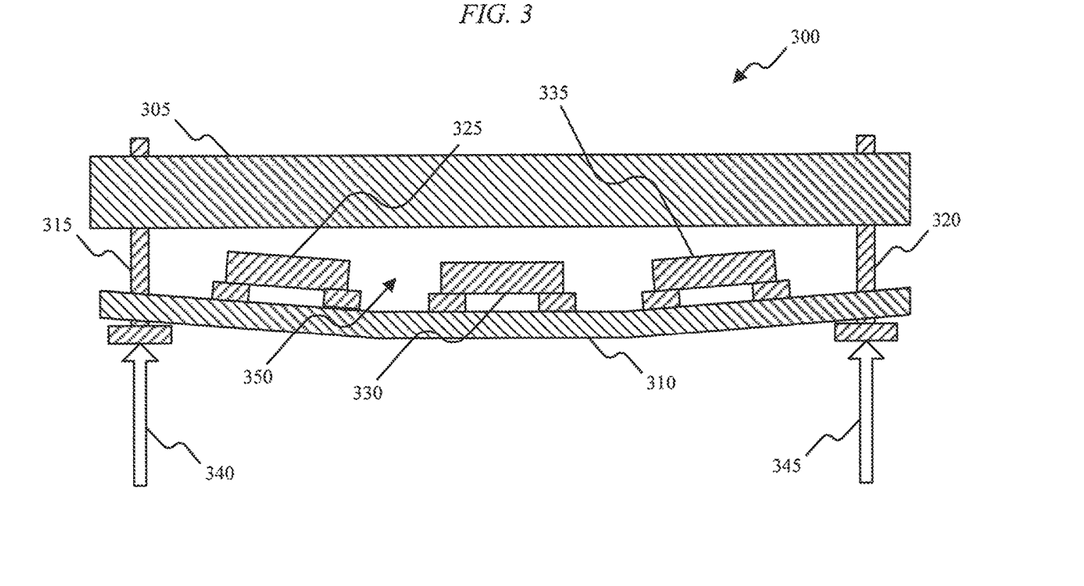
FIG. 3 is a cross section view of a printed circuit board assembly ("PCBA") without spacers between a heat sink and a printed circuit board ("PCB").

The FET switching module 245 and the controller 200, among other elements and components of the power tool 100, are implemented on a PCBA. FIG. 3 is a cross-sectional view of a PCBA 300 that includes a heat sink 305, a PCB 310, a first screw 315, a second screw 320, a first FET 325, a second FET 330, and a third FET 335. In some embodiments, the FETs 325, 330, 335 are DirectFETs. The screws 315, 320 are located around a periphery of the PCB 310. Forces or torques 340, 345 generated by turning the screws 315 and 320, respectively, while attaching the PCB 310 to the heat sink 305 cause the PCB 310 to flex. The flexing of the PCB 310 creates a gap 350 between the FETs 325, 330, 335 and the heat sink 305. As a result of the gap 350, the FETs 325, 330, 335 are pulled away from the heat sink 305 and the effectiveness of the heat sink 305 is reduced (e.g., possibly to the point of damaging the FETs 325, 330, 335).

Figure 4:
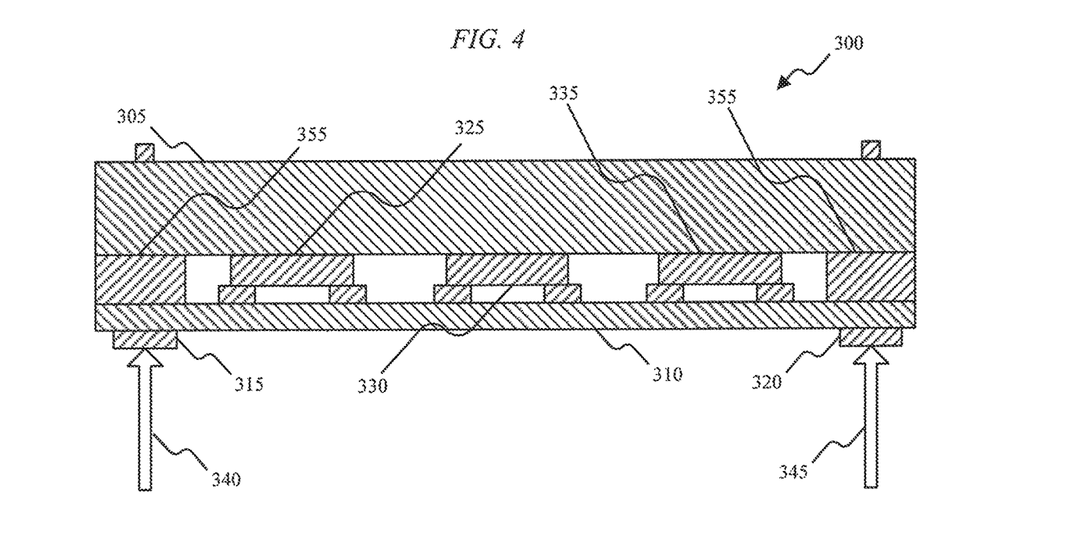
FIG. 4 is a cross section view of a PCBA including a spacer between a heat sink and a PCB.

FIG. 4 illustrates the PCBA 300 of FIG. 3 including a peripheral outline spacer 355 located between the PCB 310 and the heat sink 305. In some embodiments, the spacer 355 separates the PCB 310 from the heat sink 305. The spacer 355 is a rigid member and is operable or configured to prevent (or mitigate) the PCB 310 from flexing, bending, or warping and creating the gap 350 of FIG. 3. The spacer helps absorb excessive torsional forces from the torques 340, 345 applied to the screws 315 and 320 (i.e., the PCB 310 does not act as a lever against a corner of the FETs 325, 330, 335 and create the air gap 350). The spacer 355 also creates a seal or shield over the FETs 325, 330, 335 to keep out unwanted materials (e.g., potting material, water, etc.) that could get under the FETs and cause damage to the FETs 325, 330, 335 on the PCB 310. For example, potting material expands and contracts and can cause failures or cracking of the FETs and heat sink joints. Using the spacer 355 avoids the requirement of special, thermally stabilized epoxy under the FET bodies, which is expensive and may require special equipment and process controls. The spacer 355 is also electrically isolated or isolating to prevent shorting out traces on the PCB 310 or the drains of the FETs 325, 330, 335. In some embodiments, the spacer 355 is made of metal, a non-electrically conductive metal, a non-metal, plastic, a hard plastic, nylon, etc.

In some embodiments, the size of vias under the heat sink 305 is also kept small in order to help prevent contamination (e.g., from dust or water) from passing through the vias into the air area around and under the FETs 325, 330, 335 and heat sink 305. In other embodiments, no vias are included under the heat sink, or vias may be filled (or partially filled) with a silk screen, solder mask, or other common material to increase their resistance to the ingress of contaminants.

Figure 5:
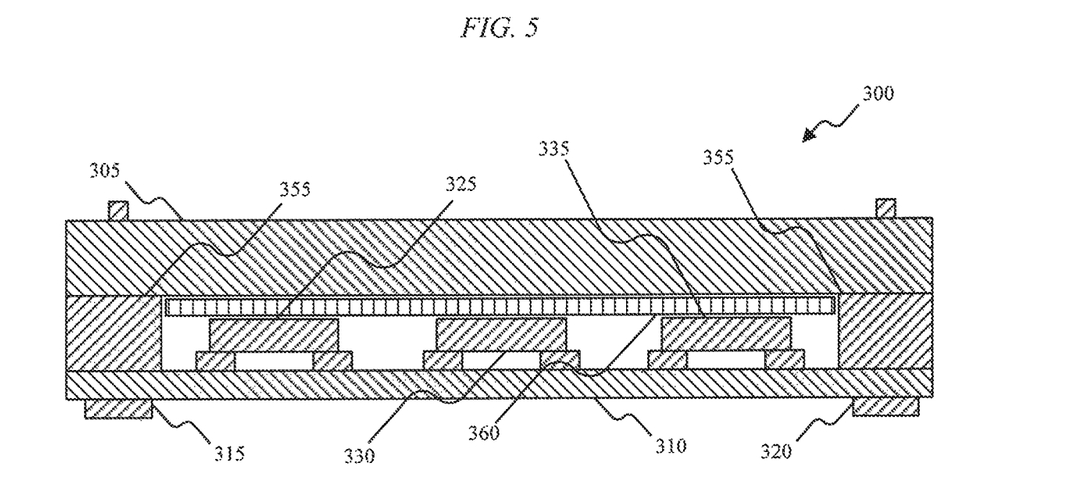
FIG. 5 is a cross section view of a PCBA including a spacer and gap pad between a heat sink and a PCB.

FIG. 5 illustrates the PCBA 300 of FIG. 3 including the spacer 355 as well as a gap pad or heat transfer material 360 located between the heat sink 305 and the FETs 325, 330, and 335. The gap pad 360 is composed of a malleable and thermally conductive material. The gap pad 360 is sandwiched between the heat sink 305 and the FETs 325, 330, 335. The gap pad 360 helps allow the screws 315, 320 to be tightened to a higher level, with lower torque control requirements, and with less precision of assembly. The gap-pad 360 also provides a thermally conductive pathway from the FETs' 325, 330, 325 surfaces to the heat sink 305 (e.g., the gap pad has a higher thermal conductivity than air). These properties of the gap pad 360 assist in ensuring a thermal connection to the FETs' 325, 330, 335 surfaces. In some embodiments, the spacer 355 is operable or configured to limit the compression of the gap pad 360. The height of the spacer 355 is selected to be greater than, for example, the combined worst case variations in soldering height, FET height, and PCB warping.

In some embodiments, the heat sink 305 includes a die casting or milling of the inverse of the spacer 355's profile into the heat sink metal. The gap pad 360, a sil pad, or another flexible pad that can conform to the heat sink's shape is used to prevent contamination. The resulting PCBA 300 includes the heat sink 305 with the spacer 355 sculpted into metal with a membrane on the side of the heat sink 305 facing the FETs. A ridge around the edge of the PCBA 300 and the screw bosses, which meet the PCB 310, provide the force on the PCB 310 to prevent contamination.

In other embodiments, the spacer 355 is replaced with spacers that (generally) surround each screw (e.g., screws 315, 320). The screw spacers take up excess screw force but do not protect against contamination in the same way as the spacer 355. Rather, silicone caulk or fill material is used along the edge of the PCB 310 to seal the edge to prevent contamination.

Figure 6:
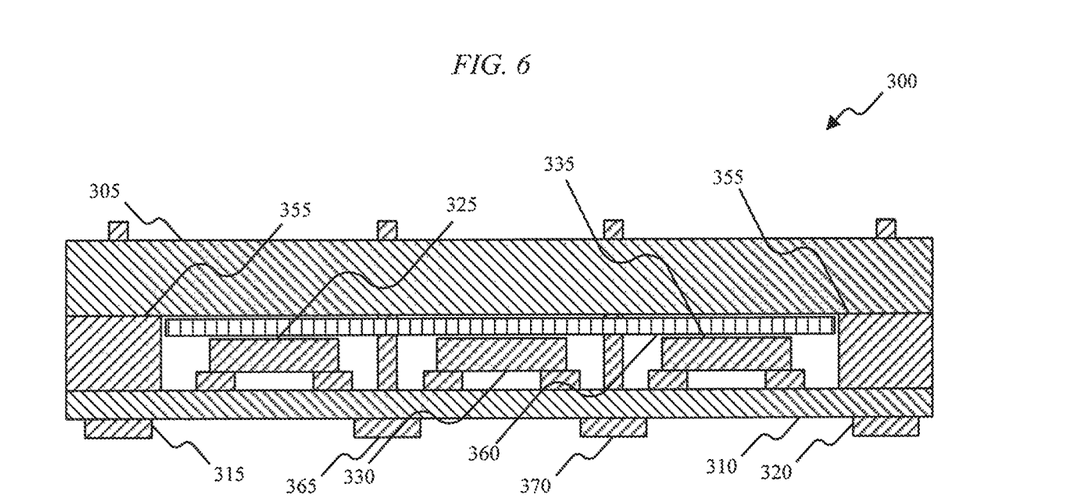
FIG. 6 is a cross section view of a PCBA including a spacer and gap pad between a heat sink and a PCB, as well as screws between switches.

FIG. 6 illustrates the PCBA 300 in a similar configuration to the PCBA 300 of FIG. 5. However, the PCBA 300 in FIG. 6 includes two additional screws 365, 370 located between the FETs 325, 330, and 335. As a result, the PCBA 300 includes FETs 325, 330, and 335 with screws between and on the periphery of the FETs. The additional screws 365, 370 are located between (i.e., on an interior portion of the PCB 310) to further limit the bending or warping of the PCB 310.

Figure 7:
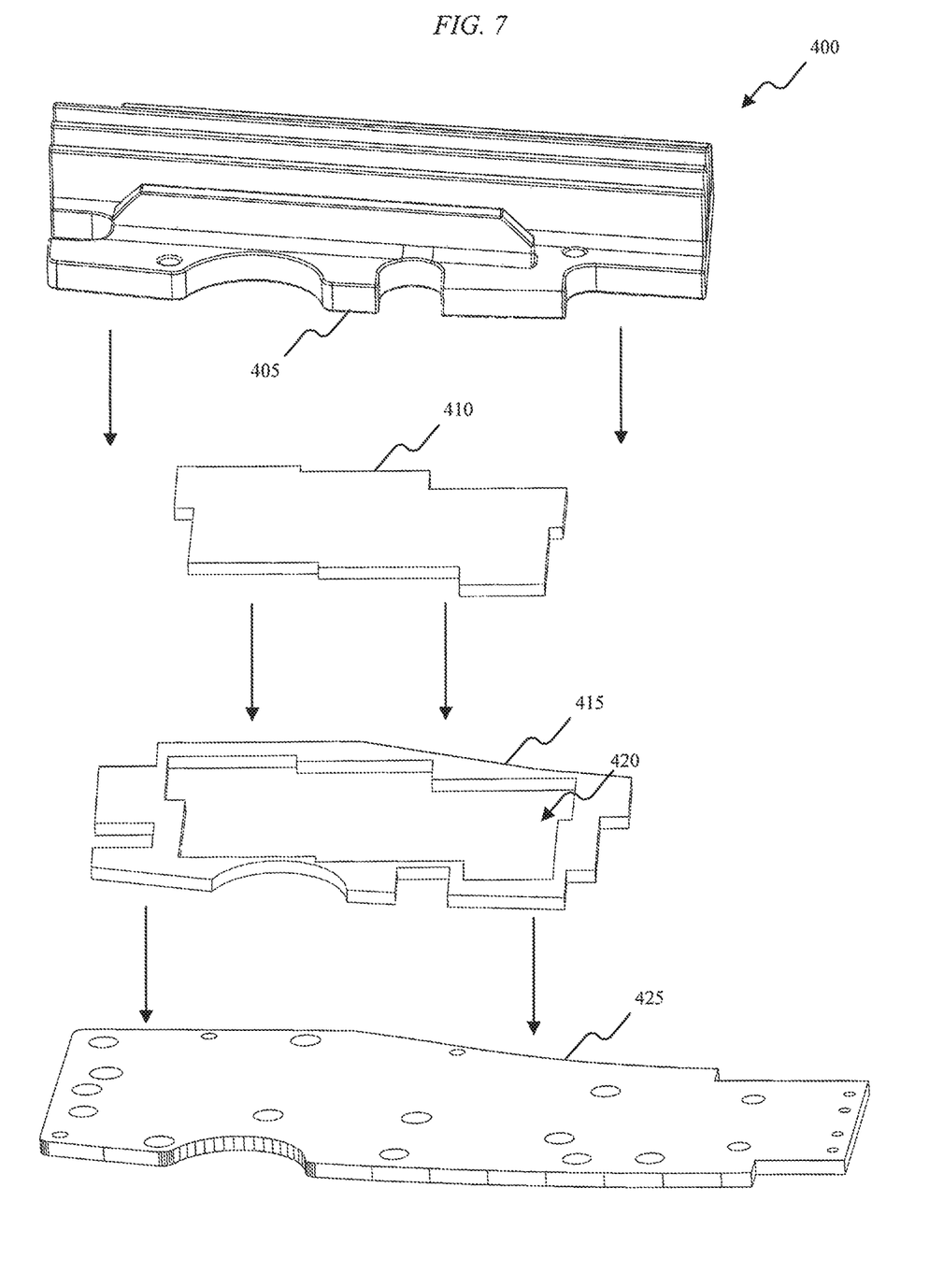
FIG. 7 is an assembly view of a PCBA including a printed circuit board ("PCB"), a spacer, a gap pad, and a heat sink.
Figure 8:
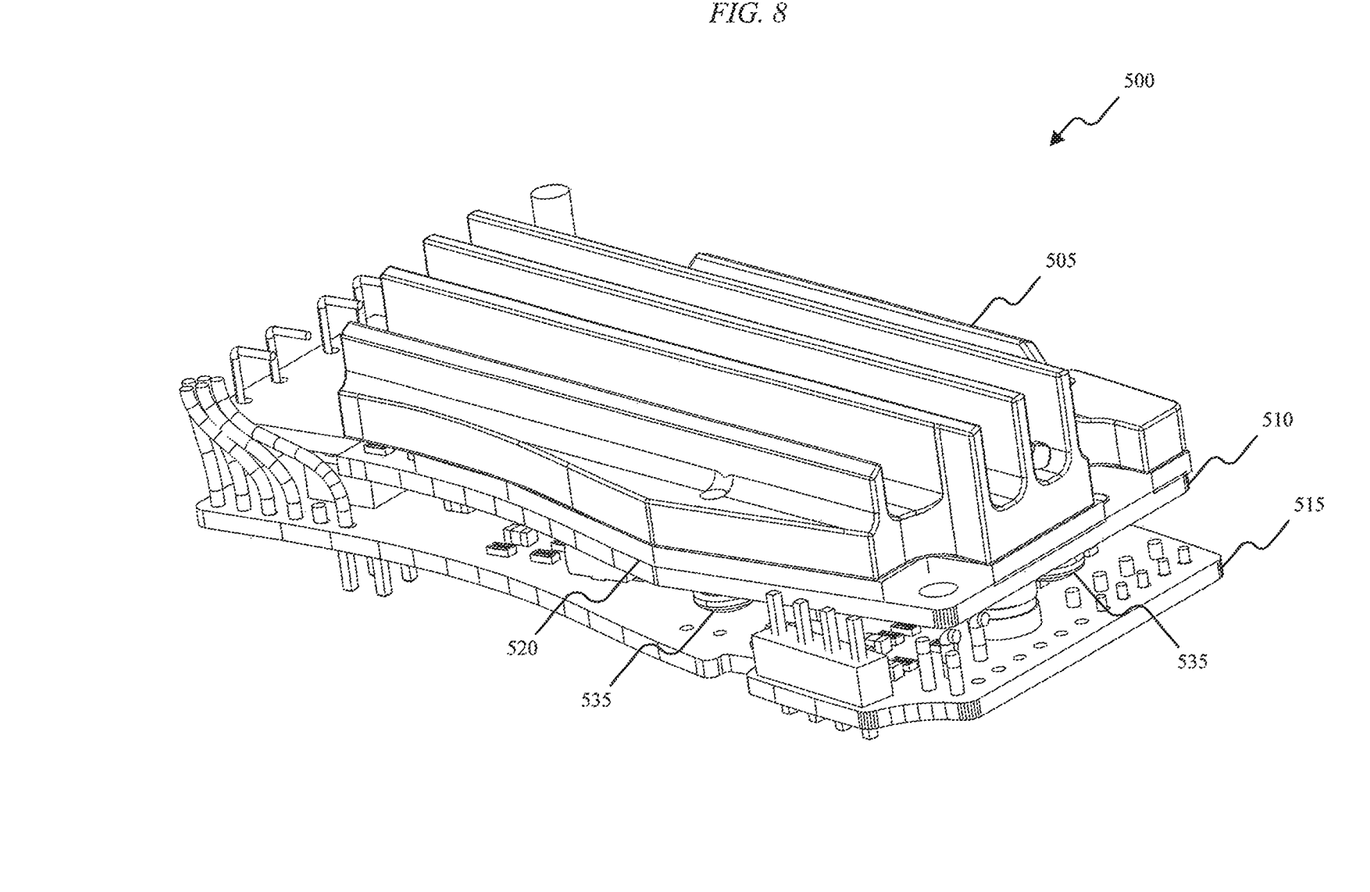
FIGS. 8-11 are perspective views of a PCBA, a heat sink, a spacer, and a gap pad.
Figure 9:
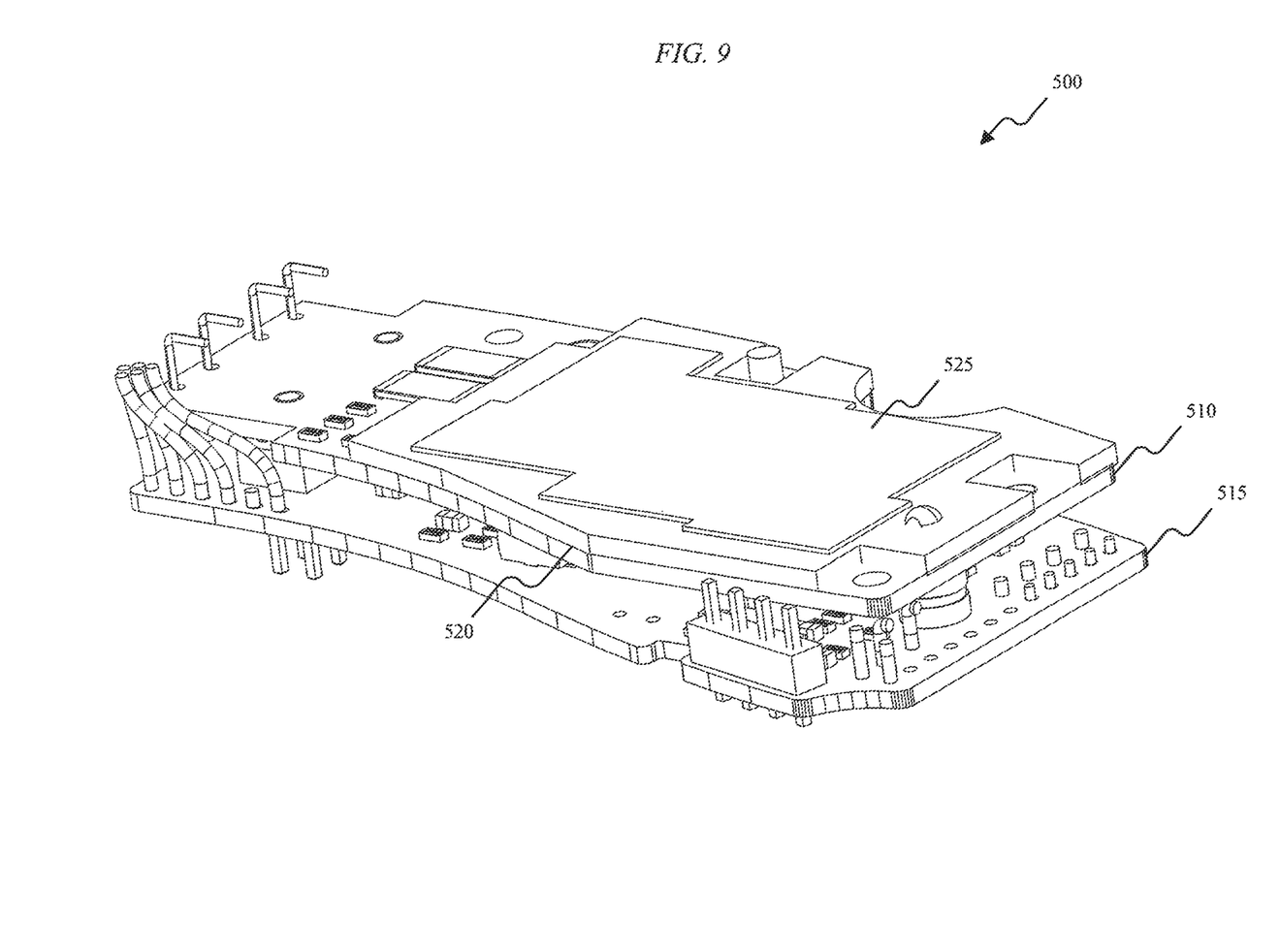
Figure 10:
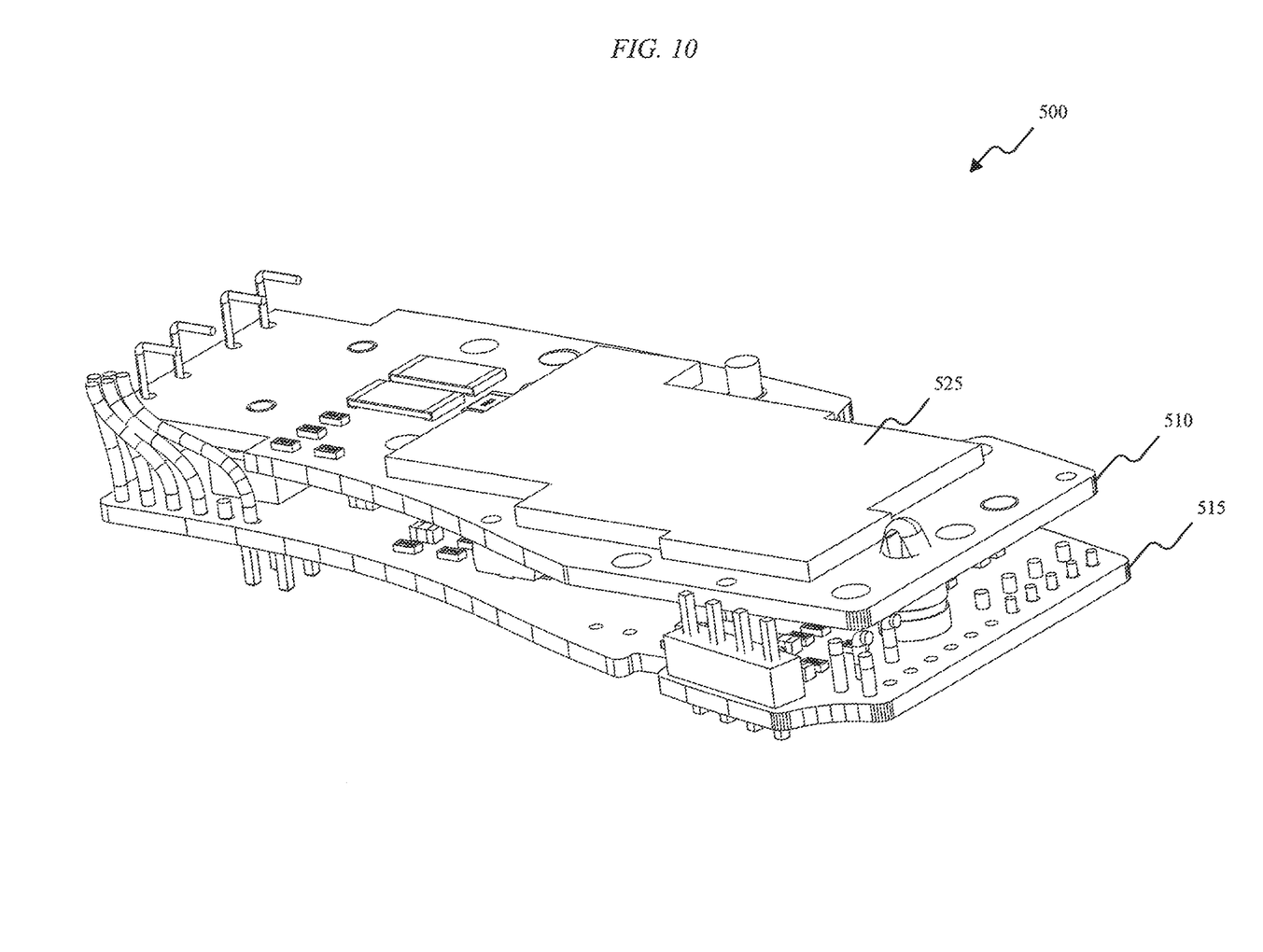
Figure 11:
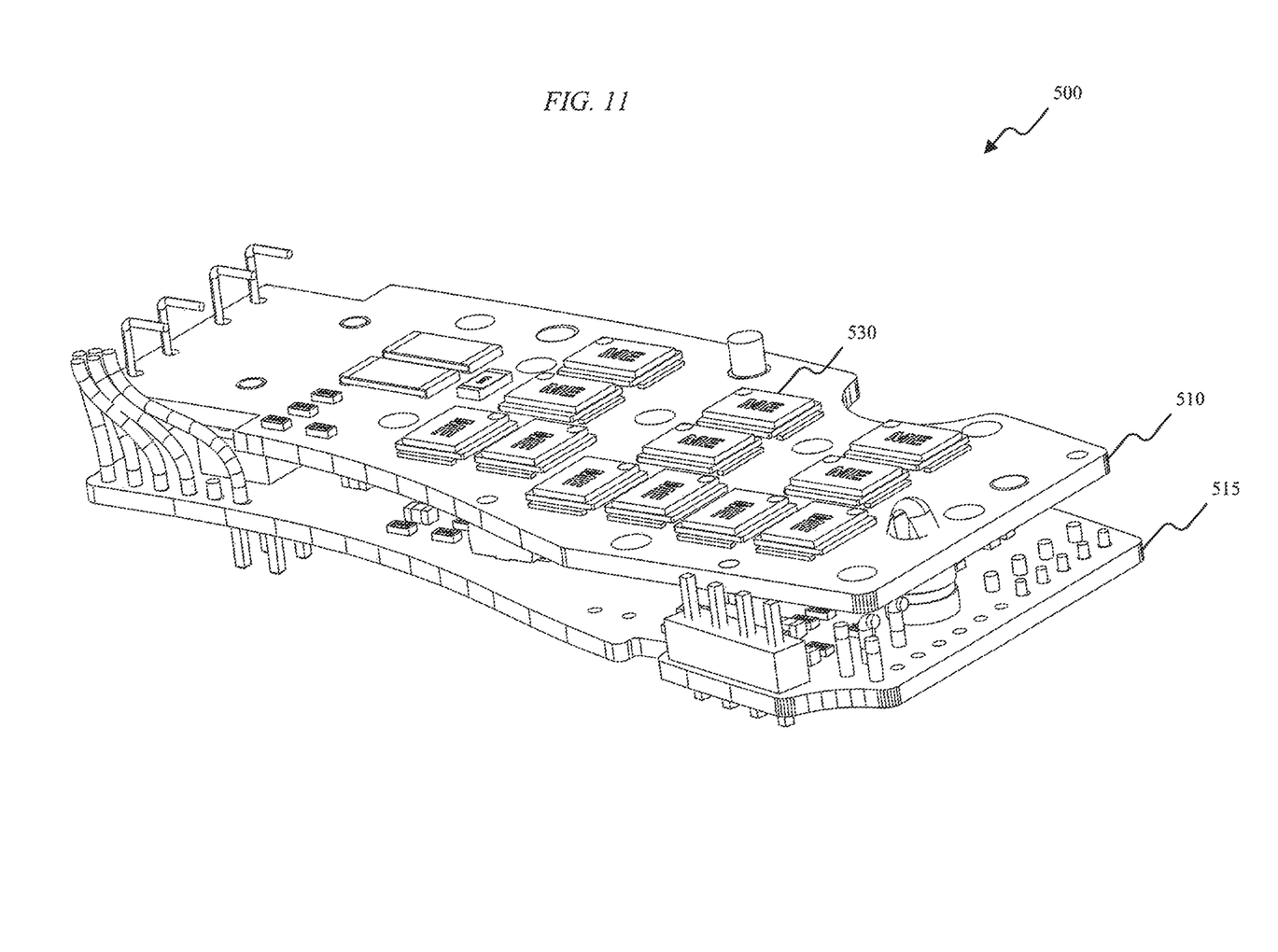

FIG. 7 illustrates an exploded view of a PCBA including a spacer and a gap pad, such as those described above with respect to FIGS. 4-6. A heat sink 405 is sits directly above a gap pad 410 and a spacer 415. The gap pad 410 is sized and shaped to fit within a recess 420 within the spacer 415. The spacer rests on top of a PCB 425 (e.g., a power PCB that includes one or more FETs).

FIGS. 8-11 illustrate a PCBA 500 including a heat sink 505, a power PCB 510, a control PCB 515, a heat sink spacer 520, a gap pad 525, FETs 530, and screws 535. The PCBA 500 of FIGS. 8-11 is located within the handle portion 110 of the power tool 100. The power PCB 510, also referred to as a power board, includes the FETs 530. The control PCB includes the controller 200. The PCBA 500 minimizes damage to the power PCB 510 and its FETs 530 due to excess screw torque, power PCB bending or warping, and reduces compression on the gap pad 525 without requiring under-fill material.

Figure 12:
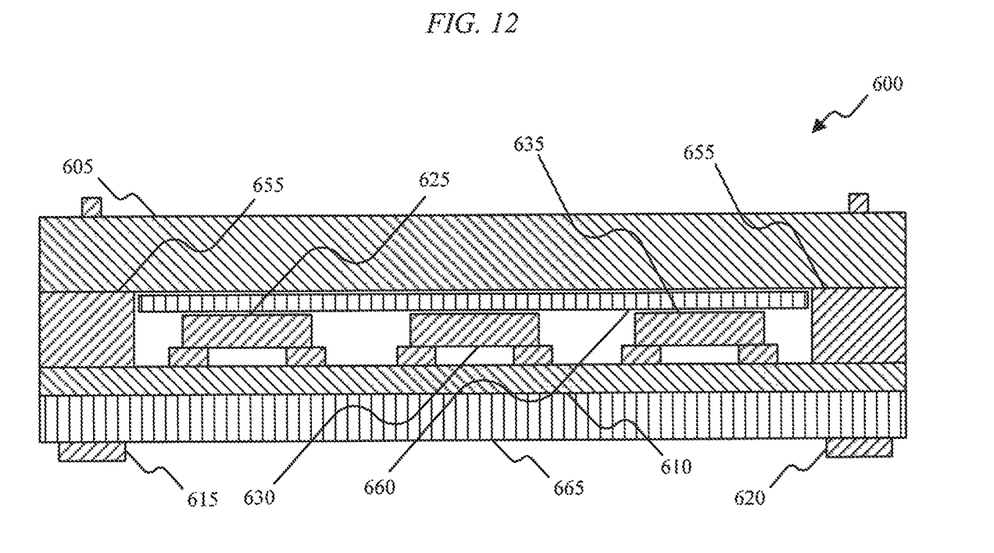
FIG. 12 is a cross section view of a PCBA including a spacer and gap pad between a heat sink and a PCB, as well as a rigid back plate beneath the PCB.

FIG. 12 illustrates a PCBA 600 similar to the PCBA 300 of FIG. 5. The PCBA 600 includes a heat sink 605, a PCB 610, a first screw 615, a second screw 620, a first FET 625, a second FET 630, a third FET 635, a spacer 655, a gap pad or heat transfer material 660, and a second heat sink or rigid member 665. The spacer 655 as well as the gap pad 660 are located between the heat sink 605 and the FETs 625, 630, and 635. The gap pad 660 is composed of a malleable and thermally conductive material. The gap pad 660 is sandwiched between the heat sink 605 and the FETs 625, 630, 635. The gap pad 660 helps allow the screws 615, 620 to be tightened to a higher level, with lower torque control requirements, and with less precision of assembly. The gap-pad 660 also provides a thermally conductive pathway from the FETs' 625, 630, 625 surfaces to the heat sink 605 (e.g., the gap pad 660 has a higher thermal conductivity than air). These properties of the gap pad 660 assist in ensuring a thermal connection to the FETs' 625, 630, 635 surfaces. In some embodiments, the spacer 655 is operable or configured to limit the compression of the gap pad 660. The heat sink or rigid member 665 is operable or configured to keep the PCB 610 flat by maintaining uniform pressure across the heat sinks 605, 665 without crushing or warping the PCB 610. The heat sink or rigid member 665 is separated from the spacer 655 by the PCB 610 and is located on an opposite side of the PCB 610 than the spacer 655. In some embodiments, the screws 615, 620 can be tightened sequentially to avoid pinching one side of the PCB 310.

Figure 13:
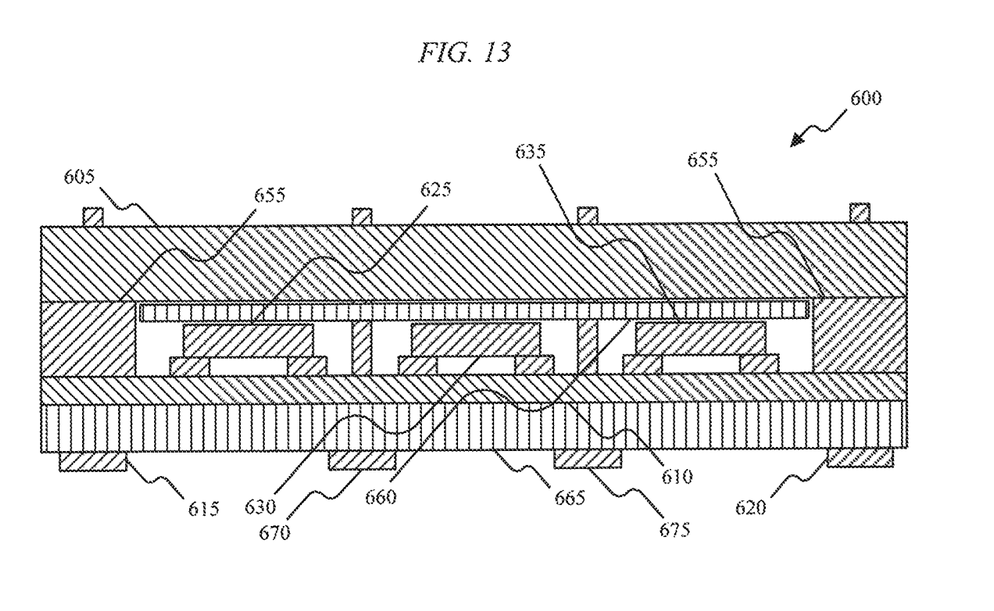
FIG. 13 is a cross section view of a PCBA including a spacer and gap pad between a heat sink and a PCB, screws between switches, and a rigid back plate beneath the PCB.

FIG. 13 illustrates the PCBA 600 in a similar configuration to the PCBA 600 of FIG. 12. However, the PCBA 600 in FIG. 13 includes two additional screws 670, 675 located between the FETs 625, 630, and 635. As a result, the PCBA 600 includes FETs 625, 630, and 635 with screws on either side of each of the FETs. The additional screws 670 are located between (i.e., on an interior portion of the PCB 610) to further limit the bending or warping of the PCB 610.

Thus, the invention provides, among other things, a power tool including a PCBA. The PCBA includes a spacer and a gap pad between a PCB and a heat sink. Various features and advantages of the invention are set forth in the following claims.

What is claimed is:

1. A power tool comprising:
    a motor; and
    a printed circuit board assembly ("PCBA") electrically connected to the motor, the PCBA including
        a printed circuit board ("PCB") including a switch,
        a heat sink operable to dissipate heat generated by the switch, the heat sink coupled to the PCB by one or more fasteners,
        a rigid spacer located between the PCB and the heat sink, wherein the rigid spacer forms an interior recess such that the interior recess has a perimeter defined by an inner wall of the rigid spacer and the switch is located in the interior recess,
        an inner fastener coupling the heat sink and the PCB with the interior recess between the heat sink and the PCB, wherein the inner fastener passes through the interior recess, and
        a gap pad positioned within the interior recess and engaged with the switch and the heat sink, wherein, before the gap pad is positioned within the interior recess and engaged with the switch and the heat sink, a height of the rigid spacer is less than a combined height of the gap pad and the switch.

2. The power tool of claim 1, wherein the inner wall is a continuous wall that surrounds at least two sides of the switch.

3. The power tool of claim 1, wherein the switch is a field-effect transistor ("FET").

4. The power tool of claim 3, wherein the FET is a DirectFET.

5. The power tool of claim 1, wherein the gap pad is made of a heat transfer material and provides a thermally conductive pathway between the switch and the heat sink.

6. The power tool of claim 1, further comprising a rigid member, the rigid member separated from the rigid spacer by the PCB and located on an opposite side of the PCB than the spacer.

7. The power tool of claim 5, wherein the rigid member is a second heat sink.

8. The power tool of claim 1, wherein the power tool is selected from the group consisting of a drill/driver, an impact wrench, a torque wrench, a saw, and a pipe cutter.

9. A power tool comprising:
    a motor; and
    a printed circuit board assembly ("PCBA") electrically connected to the motor, the PCBA including
        a printed circuit board ("PCB") including a switch,
        a heat sink operable to dissipate heat generated by the switch, the heat sink coupled to the PCB by one or more fasteners,
        a rigid spacer located between the PCB and the heat sink, wherein the rigid spacer forms an interior recess such that the interior recess has a perimeter defined by an inner wall of the rigid spacer, wherein the inner wall is a continuous wall that surrounds at least two sides of the switch, and
        an inner fastener coupling the heat sink and the PCB with the interior recess between the heat sink and the PCB, wherein the inner fastener passes through the interior recess.

10. The power tool of claim 9, wherein the switch is a field-effect transistor ("FET").

11. The power tool of claim 9, further comprising a gap pad positioned within the interior recess.

12. The power tool of claim 11, wherein the gap pad is made of a heat transfer material and provides a thermally conductive pathway between the switch and the heat sink.

13. A power tool comprising:
   a motor; and
   a printed circuit board assembly ("PCBA") electrically connected to the motor, the PCBA including
      a printed circuit board ("PCB") including a switch,
      a heat sink operable to dissipate heat generated by the switch, the heat sink coupled to the PCB by one or more fasteners,
      a rigid spacer located between the PCB and the heat sink, wherein the rigid spacer forms an interior recess such that the interior recess has a perimeter defined by an inner wall of the rigid spacer, and
      a gap pad positioned within the interior recess and engaged with the switch and the heat sink, wherein, before the gap pad is positioned within the interior recess and engaged with the switch and the heat sink, a height of the rigid spacer is less than a combined height of the gap pad and the switch.

14. The power tool of claim 13, wherein the switch is a field-effect transistor ("FET").

15. The power tool of claim 13, wherein the gap pad is made of a heat transfer material and provides a thermally conductive pathway between the switch and the heat sink.

16. The power tool of claim 13, further comprising a rigid member, the rigid member separated from the rigid spacer by the PCB and located on an opposite side of the PCB than the spacer.

17. The power tool of claim 16, wherein the rigid member is a second heat sink.

18. The power tool of claim 13, wherein the power tool is selected from the group consisting of a drill/driver, an impact wrench, a torque wrench, a saw, and a pipe cutter.

19. The power tool of claim 13, wherein the inner wall is a continuous wall that surrounds at least two sides of the switch.

* * * * *